United States Patent [19]

Chen

[11] Patent Number: 5,120,396
[45] Date of Patent: Jun. 9, 1992

[54] PROCESS FOR FORMING A FIGURE ON A PRODUCT OF STAINLESS STEEL

[76] Inventor: Kuo C. Chen, No. 15, Lane 139, Kuo An St., Tainan, Taiwan

[21] Appl. No.: 710,160

[22] Filed: Jun. 4, 1991

[51] Int. Cl.⁵ .......................... B44C 1/22; C23F 1/00
[52] U.S. Cl. ................................. 156/645; 156/659.1
[58] Field of Search .............. 156/645, 651, 654, 656, 156/658, 659.1, 660, 664; 430/320, 322, 323, 312

[56] References Cited

U.S. PATENT DOCUMENTS

| | | | |
|---|---|---|---|
| 2,102,162 | 12/1937 | Nierenberg | 156/645 X |
| 2,395,448 | 2/1946 | Brennan et al. | 156/659.1 X |
| 2,887,367 | 5/1959 | Eisner | 156/659.1 |

Primary Examiner—William A. Powell
Attorney, Agent, or Firm—Poms, Smith, Lande & Rose

[57] ABSTRACT

A process for forming a figure on a product of stainless-steel, firstly, drafting a figure on a sheet of paper and generates a first film of the figure, such that the area where the figure locates is white and the remaining area is black. Then, generating a second film of the figure based on the first film, such that the area where the figure locates is constituted by a plurality of black dots and the area other than the black dots is white. After that, engaging the second film with a silk-screen coated with sensitizers and exposing the second film, such that the figure on the second film is copied to the silk-screen, and rinsing the silk-screen. Thereafter, putting the silk-screen on a stainless-steel plate and brushes a protecting film of anti-erosive material on an overall area of the silk-screen. Subsequently, removing the silk-screen and immersing the stainless-steel plate in etchants for a period of time. Finally, processing the etched stainless-steel plate to form a desired product.

5 Claims, 1 Drawing Sheet

PROCESS FOR FORMING A FIGURE ON A PRODUCT OF STAINLESS STEEL

BACKGROUND OF THE INVENTION

The present invention relates to a process for forming a figure on a product of stainless steel.

Because of good quality and high strength, people have used stainless steel to manufacture dinner sets and other implements. However, considering the appearance, the products made from stainless steel are not as good-looking as those made of silver, even if the surfaces of the stainless-steel products have been polished. In order to improve the value of products of stainless steel, figures, such as flowers and animals, are formed on the surfaces by punching technique or sculpture technique.

In the punching technique for forming a figure on a product of stainless steel, if the figure is complex, one has to sculpt the figure by sculpture technique on a mold and then punch the product by the mold so as to form the figure on the surface of the product. However, the cost for sculpture technique is high. Moreover, a rear surface opposite to the surface of the product where the figure locates protrudes outward after the punch, affecting the value of the product.

In the sculpture technique for forming a figure on a product of stainless steel, the figure is sculpted on a surface of the product. The sculpting speed is slow and the cost is extremely high. Moreover, if an error happens in the sculpture process, the whole product is useless. Furthermore, the product with a sculpted figure thereon can only be slightly drawn, not being applicable to a deep drawing process.

The present invention provides an improved process for forming a figure on a stainless-steel product.

SUMMARY OF THE INVENTION

It is an object of the present invention to provide a process for forming a figure on a product of stainless steel in which the figure is formed by dot etching.

It is another object of the present invention to provide a process for forming a figure on a product of stainless steel in which the cost for the process is low.

These and additional objects, if not set forth specifically herein, will be readily apparent to those skilled in the art from the detailed description provided hereunder, with appropriate reference to the accompanying drawings.

DETAILED DESCRIPTION OF THE PREFERRED EMBODIMENTS

Figure 1:
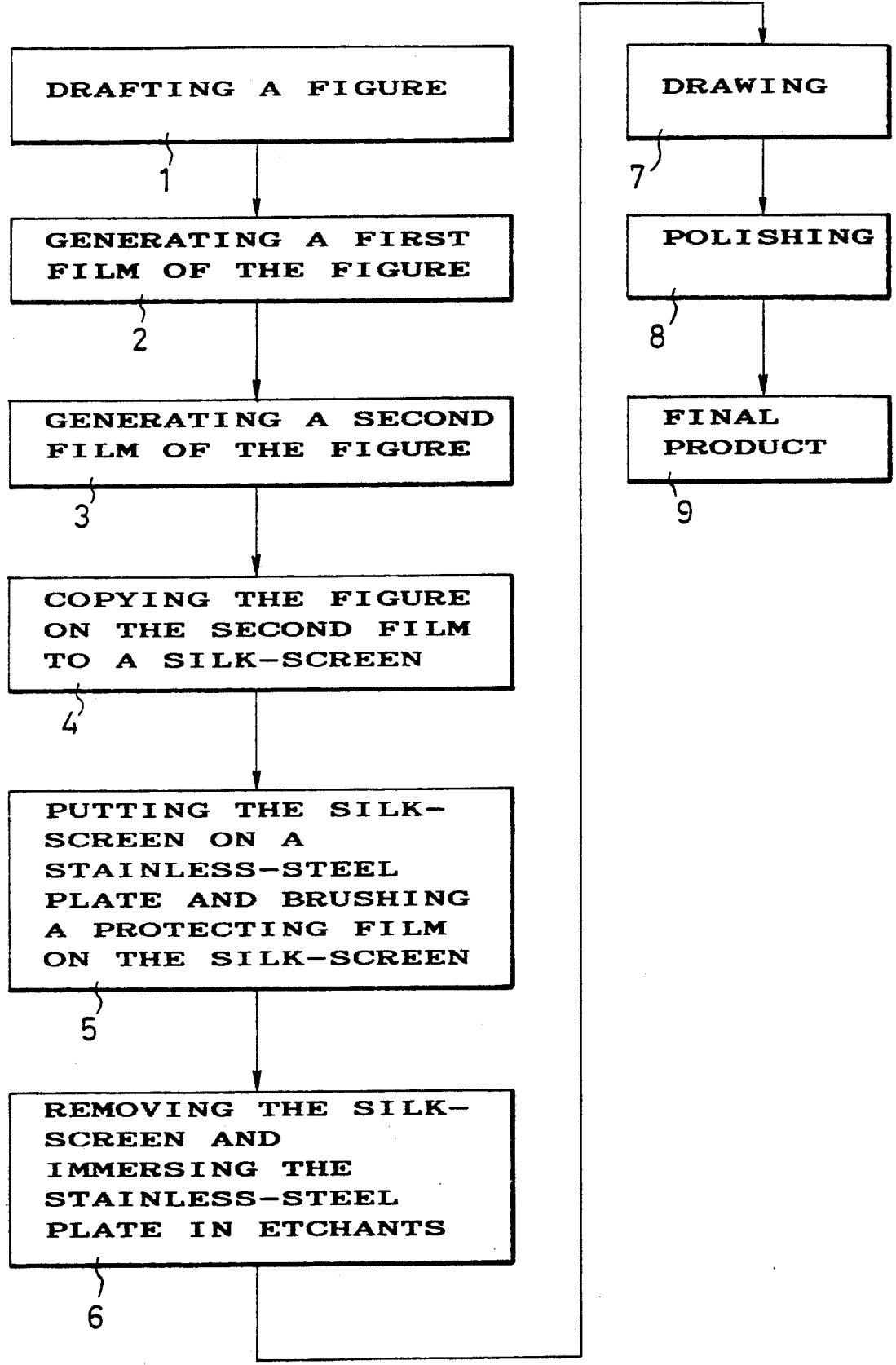
FIG. 1 is a flow chart outlining a process for forming figures on products of stainless steel of the present invention.

Referring to FIG. 1, the process for forming a figure on a product of stainless steel according to the present invention comprises the following steps:

(1) Drafting a figure, such as flowers, fishes, trees, or the like, on a sheet of paper, preferably a translucent paper generally used in drafting figures (see step 1).

(2) Generating a first film of the figure such that the area where the figure locates is white and the remaining area is black (see step 2).

(3) Generating a second film of the figure based on the first film such that the area where the figure locates is constituted by a plurality of black dots and the area other than the black dots is white. It is noted that the dots are black and the gaps between the dots are white (see step 3).

(4) Engaging the second film with a silk-screen coated with sensitizers and exposing the second film, such that the figure on the second film is copied to the silk-screen; thereafter, rinsing the silk-screen. Due to the characteristic of sensitizers, after exposure and rinsing, the sensitizers on the white area are rinsed away, leaving a space on the silk-screen. To the contrary, after exposure and rinsing, the sensitizers on the dotted black area cannot be rinsed away (see step 4).

(5) Putting the silk-screen on a stainless-steel plate and brushing a protecting film of anti-erosive material on the entire silk-screen. Apparently, the anti-erosive material may be pasted on the surface of the stainless-steel plate via the space on the silk-screen (where the dots do not occupy), and the dotted area forbids the anti-erosive material to pass through the silk-screen (see step 5).

(6) Removing the silk-screen and immersing the stainless-steel plate in a container with etchants for a period of time. On the stainless-steel plate, the area coated with the anti-erosive material (i.e., the area other than the dotted area) is not etched, and the dotted area is etched. After a certain period of time, the stainless-steel plate is removed from the immersing container, and the figure is formed (by dot etching) on the surface of the stainless-steel plate. The period of time of etching depends on the width of the stainless steel plate. The etching procedure does not affect the strength and other qualities of the stainless-steel plate (see step 6).

(7) Drawing the stainless steel plate, e.g., by hydraulic punch, to form a raw shape of the final desired product. After the drawing, the figure extends in its longitudinal and transverse direction, making the figure more apparent (see step 7).

(8) Polishing the stainless steel plate. The etched dotted area is recessed by the etchants, the surface other than the dotted figure area polished, providing a contrast (see step 8).

(9) Proceeding with subsequent processing of the polished raw product to form a shape of the desired final product, such as a teakettle or a cover of a pot (see step 9).

While the present invention has been explained in relation to its preferred process, it is to be understood that various modifications thereof will be apparent to those skilled in the art upon reading this specification. For example, the figure also can be constituted by a stripe at step 3. Therefore, it is to be understood that the invention disclosed herein is intended to cover all such modifications as fall within the scope of the appended claims

I claim:

1. A process for forming a figure on a product of stainless steel comprising the steps of:
   (a) drafting a figure on a sheet of paper;
   (b) generating a first film of the figure such that the area where the figure locates is white and the remaining area is black;
   (c) generating a second film of the figure based on the first film such that the area where the figure locates is constituted by a plurality of black dots and the area other than the black dots are white;

(d) engaging the second film with a silk-screen coated with sensitizers and exposing the second film such that the figure on the second film is copied to the silk-screen;
(e) rinsing the silk-screen;
(f) putting the silk-screen on a stainless-steel plate and brushing a protecting film of anti-erosive material on an overall area of the silk-screen; and
(g) removing the silk-screen and immersing the stainless-steel plate in etchants for a period of time.

2. The process as claimed in claim 1, further comprising a step of processing the etched stainless-steel plate to form a desired final product.

3. The process as claimed in claim 2, wherein the process comprises a step of (h) drawing the stainless-steel plate to form a raw product of the final desired product after step (g), such that the dotted figure extends in a longitudinal and transverse direction thereof.

4. The process as claimed in claim 3, wherein the process comprises a step of (i) polishing the raw product after the step (h).

5. The process as claimed in claim 4, wherein the process comprises a step of (j) proceeding with subsequent processing of the polished raw product to form a shape of the desired final product after the step (i).

* * * * *